(12) United States Patent
Shtrom et al.

(10) Patent No.: US 9,379,456 B2
(45) Date of Patent: Jun. 28, 2016

(54) ANTENNA ARRAY

(71) Applicants: Victor Shtrom, Sunnyvale, CA (US);
Darin T. Milton, Campbell, CA (US);
William S. Kish, Saratoga, CA (US)

(72) Inventors: Victor Shtrom, Sunnyvale, CA (US);
Darin T. Milton, Campbell, CA (US);
William S. Kish, Saratoga, CA (US)

(73) Assignee: RUCKUS WIRELESS, INC.,
Sunnyvale, CA (US)

( * ) Notice: Subject to any disclaimer, the term of this patent is extended or adjusted under 35 U.S.C. 154(b) by 293 days.

(21) Appl. No.: 13/862,834

(22) Filed: Apr. 15, 2013

(65) Prior Publication Data

US 2013/0241789 A1    Sep. 19, 2013

Related U.S. Application Data

(63) Continuation of application No. 12/425,374, filed on Apr. 16, 2009, now abandoned, which is a continuation of application No. 11/714,707, filed on Mar. 5, 2007, now Pat. No. 7,525,486, which is a continuation of application No. 11/022,080, filed on Dec. 23, 2004, now Pat. No. 7,193,562.

(60) Provisional application No. 60/630,499, filed on Nov. 22, 2004.

(51) Int. Cl.
*H01Q 1/38* (2006.01)
*H01Q 25/00* (2006.01)
(Continued)

(52) U.S. Cl.
CPC .............. *H01Q 25/00* (2013.01); *H01Q 1/38* (2013.01); *H01Q 3/24* (2013.01); *H01Q 9/04* (2013.01);
(Continued)

(58) Field of Classification Search
CPC ............ H01Q 1/38; H01Q 3/24; H01Q 9/28; H01Q 9/285; H01Q 25/00; H01Q 9/04; H01Q 9/16; H01Q 21/29; H01Q 21/20

USPC .................. 343/818, 700 MS, 793, 876
See application file for complete search history.

(56) References Cited

U.S. PATENT DOCUMENTS 723,188 A    3/1903    Tesla
725,605 A    4/1903    Tesla
(Continued)

FOREIGN PATENT DOCUMENTS

AU    2003/227399    10/2003
CA       02494982    10/2003
(Continued)

OTHER PUBLICATIONS

U.S. Appl. No. 12/980,253, Office Action mailed Mar. 27, 2014.
(Continued)

*Primary Examiner* — Hoanganh Le
(74) *Attorney, Agent, or Firm* — Lewis Roca Rothgerber Christie LLP

(57) ABSTRACT

A circuit board for wireless communications includes communication circuitry for modulating and/or demodulating a radio frequency (RF) signal and an antenna apparatus for transmitting and receiving the RF signal, the antenna apparatus having selectable antenna elements located near one or more peripheries of the circuit board. A first antenna element produces a first directional radiation pattern; a second antenna element produces a second directional radiation pattern offset from the first radiation pattern. The antenna elements may include one or more reflectors configured to provide gain and broaden the frequency response of the antenna element. A switching network couples one or more of the selectable elements to the communication circuitry and provides impedance matching regardless of which or how many of the antenna elements are selected. Selecting different combinations of antenna elements results in a configurable radiation pattern; alternatively, selecting several elements may result in an omnidirectional radiation pattern.

18 Claims, 5 Drawing Sheets

(51) Int. Cl.

| | |
|---|---|
| *H01Q 3/24* | (2006.01) |
| *H01Q 9/28* | (2006.01) |
| *H01Q 21/20* | (2006.01) |
| *H01Q 9/04* | (2006.01) |
| *H01Q 9/16* | (2006.01) |
| *H01Q 21/29* | (2006.01) |
| *H05K 1/16* | (2006.01) |

(52) U.S. Cl.
CPC . *H01Q 9/16* (2013.01); *H01Q 9/28* (2013.01); *H01Q 9/285* (2013.01); *H01Q 21/20* (2013.01); *H01Q 21/29* (2013.01); *H05K 1/16* (2013.01)

(56) References Cited

U.S. PATENT DOCUMENTS

| | | | |
|---|---|---|---|
| 1,869,659 A | 8/1932 | Broertjes |
| 2,292,387 A | 8/1942 | Markey et al. |
| 3,488,445 A | 1/1970 | Chang |
| 3,568,105 A | 3/1971 | Felsenheld |
| 3,721,990 A | 3/1973 | Gibson et al. |
| 3,887,925 A | 6/1975 | Ranghelli |
| 3,967,067 A | 6/1976 | Potter |
| 3,969,730 A | 7/1976 | Fuchser |
| 3,982,214 A | 9/1976 | Burns |
| 3,991,273 A | 11/1976 | Mathes |
| 4,001,734 A | 1/1977 | Burns |
| 4,027,307 A | 5/1977 | Litchford |
| 4,176,356 A | 11/1979 | Foster et al. |
| 4,193,077 A | 3/1980 | Greenberg et al. |
| 4,203,118 A | 5/1980 | Alford |
| 4,253,193 A | 2/1981 | Kennard |
| 4,305,052 A | 12/1981 | Baril et al. |
| 4,513,412 A | 4/1985 | Cox |
| 4,554,554 A | 11/1985 | Olesen et al. |
| 4,733,203 A | 3/1988 | Ayasli |
| 4,764,773 A | 8/1988 | Larsen et al. |
| 4,800,393 A | 1/1989 | Edward et al. |
| 4,814,777 A | 3/1989 | Monser |
| 4,821,040 A | 4/1989 | Johnson et al. |
| 4,920,285 A | 4/1990 | Clark et al. |
| 4,937,585 A | 6/1990 | Shoemaker |
| 5,063,574 A | 11/1991 | Moose |
| 5,097,484 A | 3/1992 | Akaiwa |
| 5,173,711 A | 12/1992 | Takeuchi et al. |
| 5,203,010 A | 4/1993 | Felix |
| 5,208,564 A | 5/1993 | Burns et al. |
| 5,220,340 A | 6/1993 | Shafai |
| 5,241,693 A | 8/1993 | Kim |
| 5,282,222 A | 1/1994 | Fattouche et al. |
| 5,291,289 A | 3/1994 | Hulyalkar et al. |
| 5,311,550 A | 5/1994 | Fouche et al. |
| 5,337,066 A | 8/1994 | Hirata et al. |
| 5,373,548 A | 12/1994 | McCarthy |
| 5,434,575 A | 7/1995 | Jelinek |
| 5,453,752 A | 9/1995 | Wang et al. |
| 5,479,176 A | 12/1995 | Zavrel |
| 5,507,035 A | 4/1996 | Bantz |
| 5,532,708 A | 7/1996 | Krenz et al. |
| 5,559,800 A | 9/1996 | Mousseau et al. |
| 5,726,666 A | 3/1998 | Hoover et al. |
| 5,754,145 A | 5/1998 | Evans |
| 5,767,755 A | 6/1998 | Kim et al. |
| 5,767,807 A | 6/1998 | Pritchett |
| 5,767,809 A | 6/1998 | Chuang et al. |
| 5,786,793 A | 7/1998 | Maeda et al. |
| 5,802,312 A | 9/1998 | Lazaridis et al. |
| 5,828,346 A | 10/1998 | Park |
| 5,936,595 A | 8/1999 | Wang |
| 5,964,830 A | 10/1999 | Durrett |
| 5,966,102 A | 10/1999 | Runyon |
| 5,990,838 A | 11/1999 | Burns et al. |
| 6,005,519 A | 12/1999 | Burns |
| 6,005,525 A | 12/1999 | Kivela |
| 6,011,450 A | 1/2000 | Miya |
| 6,023,250 A | 2/2000 | Cronyn |
| 6,031,503 A | 2/2000 | Preiss, II et al. |
| 6,034,638 A | 3/2000 | Thiel et al. |
| 6,046,703 A | 4/2000 | Wang |
| 6,052,093 A | 4/2000 | Yao et al. |
| 6,061,025 A | 5/2000 | Jackson |
| 6,067,053 A | 5/2000 | Runyon et al. |
| 6,091,364 A | 7/2000 | Murakami et al. |
| 6,094,177 A | 7/2000 | Yamamoto |
| 6,097,347 A | 8/2000 | Duan et al. |
| 6,104,356 A | 8/2000 | Hikuma et al. |
| 6,169,523 B1 | 1/2001 | Ploussios |
| 6,249,216 B1 | 6/2001 | Flick |
| 6,266,528 B1 | 7/2001 | Farzaneh |
| 6,281,762 B1 | 8/2001 | Nakao |
| 6,288,682 B1 | 9/2001 | Thiel et al. |
| 6,292,153 B1 | 9/2001 | Aiello et al. |
| 6,307,524 B1 | 10/2001 | Britain |
| 6,317,599 B1 | 11/2001 | Rappaport et al. |
| 6,323,810 B1 | 11/2001 | Poilasne et al. |
| 6,326,922 B1 | 12/2001 | Hegendoerfer |
| 6,326,924 B1 | 12/2001 | Muramoto et al. |
| 6,337,628 B2 | 1/2002 | Campana, Jr. |
| 6,337,668 B1 | 1/2002 | Ito et al. |
| 6,339,404 B1 | 1/2002 | Johnson |
| 6,345,043 B1 | 2/2002 | Hsu |
| 6,351,240 B1 | 2/2002 | Karimullah et al. |
| 6,356,242 B1 | 3/2002 | Ploussios |
| 6,356,243 B1 | 3/2002 | Schneider et al. |
| 6,356,905 B1 | 3/2002 | Gershman et al. |
| 6,366,254 B1 | 4/2002 | Sievenpiper |
| 6,377,227 B1 | 4/2002 | Zhu et al. |
| 6,392,610 B1 | 5/2002 | Braun et al. |
| 6,396,456 B1 | 5/2002 | Chiang et al. |
| 6,400,329 B1 | 6/2002 | Barnes |
| 6,404,386 B1 | 6/2002 | Proctor, Jr. et al. |
| 6,407,719 B1 | 6/2002 | Ohira et al. |
| RE37,802 E | 7/2002 | Fattouche et al. |
| 6,414,647 B1 | 7/2002 | Lee |
| 6,424,311 B1 | 7/2002 | Tsai et al. |
| 6,442,507 B1 | 8/2002 | Skidmore et al. |
| 6,445,688 B1 | 9/2002 | Garces et al. |
| 6,456,242 B1 | 9/2002 | Crawford |
| 6,476,773 B2 | 11/2002 | Palmer |
| 6,492,957 B2 | 12/2002 | Carillo et al. |
| 6,493,679 B1 | 12/2002 | Rappaport et al. |
| 6,496,083 B1 | 12/2002 | Kushitani et al. |
| 6,498,589 B1 | 12/2002 | Horii |
| 6,499,006 B1 | 12/2002 | Rappaport et al. |
| 6,507,321 B2 | 1/2003 | Oberschmidt et al. |
| 6,521,422 B1 | 2/2003 | Hsu |
| 6,531,985 B1 | 3/2003 | Jones et al. |
| 6,545,643 B1 | 4/2003 | Sward |
| 6,583,765 B1 | 6/2003 | Schamberger et al. |
| 6,586,786 B2 | 7/2003 | Kitazawa et al. |
| 6,593,891 B2 | 7/2003 | Zhang |
| 6,606,059 B1 | 8/2003 | Barabash |
| 6,611,230 B2 | 8/2003 | Phelan |
| 6,621,029 B2 | 9/2003 | Galmiche |
| 6,625,454 B1 | 9/2003 | Rappaport et al. |
| 6,633,206 B1 | 10/2003 | Kato |
| 6,642,889 B1 | 11/2003 | McGrath |
| 6,642,890 B1 | 11/2003 | Chen |
| 6,674,459 B2 | 1/2004 | Ben-Shachar et al. |
| 6,700,546 B2 | 3/2004 | Benhammou et al. |
| 6,701,522 B1 | 3/2004 | Rubin et al. |
| 6,724,346 B2 | 4/2004 | Le Bolzer |
| 6,725,281 B1 | 4/2004 | Zintel et al. |
| 6,741,219 B2 | 5/2004 | Shor |
| 6,747,605 B2 | 6/2004 | Lebaric |
| 6,753,814 B2 | 6/2004 | Killen et al. |
| 6,757,267 B1 | 6/2004 | Evans |
| 6,762,723 B2 | 7/2004 | Nallo et al. |
| 6,774,852 B2 | 8/2004 | Chiang et al. |
| 6,774,864 B2 | 8/2004 | Evans |
| 6,779,004 B1 | 8/2004 | Zintel et al. |
| 6,819,287 B2 | 11/2004 | Sullivan et al. |
| 6,822,617 B1 | 11/2004 | Mather et al. |
| 6,839,038 B2 | 1/2005 | Weinstein |

(56) References Cited

U.S. PATENT DOCUMENTS

| | | |
|---|---|---|
| 6,859,176 B2 | 2/2005 | Choi |
| 6,859,182 B2 | 2/2005 | Horii |
| 6,864,852 B2 | 3/2005 | Chiang et al. |
| 6,876,280 B2 | 4/2005 | Nakano |
| 6,876,836 B2 | 4/2005 | Lin et al. |
| 6,879,293 B2 | 4/2005 | Sato |
| 6,888,504 B2 | 5/2005 | Chiang et al. |
| 6,888,893 B2 | 5/2005 | Li et al. |
| 6,892,230 B1 | 5/2005 | Gu et al. |
| 6,894,653 B2 | 5/2005 | Chiang et al. |
| 6,903,686 B2 | 6/2005 | Vance et al. |
| 6,906,678 B2 | 6/2005 | Chen |
| 6,910,068 B2 | 6/2005 | Zintel et al. |
| 6,914,566 B2 * | 7/2005 | Beard ............ 343/702 |
| 6,914,581 B1 | 7/2005 | Popek |
| 6,924,768 B2 | 8/2005 | Wu et al. |
| 6,931,429 B2 | 8/2005 | Gouge et al. |
| 6,933,907 B2 | 8/2005 | Shirosaka |
| 6,941,143 B2 | 9/2005 | Mathur |
| 6,943,749 B2 | 9/2005 | Paun |
| 6,950,019 B2 | 9/2005 | Bellone et al. |
| 6,950,069 B2 | 9/2005 | Gaucher et al. |
| 6,961,028 B2 | 11/2005 | Joy et al. |
| 6,965,353 B2 | 11/2005 | Shirosaka et al. |
| 6,973,622 B1 | 12/2005 | Rappaport et al. |
| 6,975,834 B1 | 12/2005 | Forster |
| 6,980,782 B1 | 12/2005 | Braun et al. |
| 7,023,909 B1 | 4/2006 | Adams et al. |
| 7,024,225 B2 | 4/2006 | Ito |
| 7,034,769 B2 | 4/2006 | Surducan et al. |
| 7,034,770 B2 | 4/2006 | Yang et al. |
| 7,043,277 B1 | 5/2006 | Pfister |
| 7,046,201 B2 | 5/2006 | Okada |
| 7,050,809 B2 | 5/2006 | Lim |
| 7,053,844 B2 | 5/2006 | Gaucher et al. |
| 7,064,717 B2 | 6/2006 | Kaluzni |
| 7,085,814 B1 | 8/2006 | Gandhi et al. |
| 7,088,299 B2 | 8/2006 | Siegler et al. |
| 7,088,306 B2 | 8/2006 | Chiang et al. |
| 7,089,307 B2 | 8/2006 | Zintel et al. |
| 7,098,863 B2 | 8/2006 | Bancroft |
| D530,325 S | 10/2006 | Kerila |
| 7,120,405 B2 | 10/2006 | Rofougaran |
| 7,130,895 B2 | 10/2006 | Zintel et al. |
| 7,148,846 B2 | 12/2006 | Qi et al. |
| 7,162,273 B1 | 1/2007 | Ambramov et al. |
| 7,164,380 B2 | 1/2007 | Saito |
| 7,171,475 B2 | 1/2007 | Weisman et al. |
| 7,193,562 B2 | 3/2007 | Shtrom |
| 7,206,610 B2 | 4/2007 | Iacono et al. |
| 7,215,296 B2 | 5/2007 | Ambramov et al. |
| 7,277,063 B2 | 10/2007 | Shirosaka et al. |
| 7,292,198 B2 | 11/2007 | Shtrom et al. |
| 7,292,870 B2 | 11/2007 | Heredia et al. |
| 7,295,825 B2 | 11/2007 | Raddant |
| 7,298,228 B2 | 11/2007 | Sievenpiper |
| 7,312,762 B2 | 12/2007 | Puente Ballarda et al. |
| 7,319,432 B2 | 1/2008 | Andersson |
| 7,333,460 B2 | 2/2008 | Vaisanen et al. |
| 7,358,912 B1 | 4/2008 | Kish et al. |
| 7,362,280 B2 | 4/2008 | Shtrom |
| 7,385,563 B2 | 6/2008 | Bishop |
| 7,498,999 B2 | 3/2009 | Shtrom et al. |
| 7,511,680 B2 | 3/2009 | Shtrom et al. |
| 7,522,569 B2 | 4/2009 | Rada |
| 7,525,486 B2 | 4/2009 | Shtrom |
| 7,609,648 B2 | 10/2009 | Hoffmann et al. |
| 7,697,550 B2 | 4/2010 | Rada |
| 7,733,275 B2 | 6/2010 | Hirota |
| 7,782,895 B2 | 8/2010 | Pasanen et al. |
| 7,835,697 B2 | 11/2010 | Wright |
| 7,847,741 B2 | 12/2010 | Hirota |
| 7,864,119 B2 | 1/2011 | Shtrom et al. |
| 7,893,882 B2 | 2/2011 | Shtrom |
| 7,916,463 B2 | 3/2011 | Aya et al. |
| 8,068,068 B2 | 11/2011 | Kish et al. |
| 8,085,206 B2 | 12/2011 | Shtrom |
| 8,217,843 B2 | 7/2012 | Shtrom |
| 8,355,912 B1 | 1/2013 | Keesey et al. |
| 8,358,248 B2 | 1/2013 | Shtrom |
| 8,686,905 B2 | 4/2014 | Shtrom |
| 8,704,720 B2 | 4/2014 | Kish |
| 8,723,741 B2 | 5/2014 | Shtrom |
| 8,756,668 B2 | 6/2014 | Ranade et al. |
| 8,836,606 B2 | 9/2014 | Kish |
| 9,019,165 B2 | 4/2015 | Shtrom |
| 9,093,758 B2 | 7/2015 | Kish |
| 2001/0046848 A1 | 11/2001 | Kenkel |
| 2002/0031130 A1 | 3/2002 | Tsuchiya et al. |
| 2002/0036586 A1 | 3/2002 | Gothard et al. |
| 2002/0047800 A1 | 4/2002 | Proctor, Jr. et al. |
| 2002/0080767 A1 | 6/2002 | Lee |
| 2002/0084942 A1 | 7/2002 | Tsai et al. |
| 2002/0101377 A1 | 8/2002 | Crawford |
| 2002/0105471 A1 | 8/2002 | Kojima et al. |
| 2002/0112058 A1 | 8/2002 | Weisman et al. |
| 2002/0119757 A1 | 8/2002 | Hamabe |
| 2002/0158798 A1 | 10/2002 | Chiang et al. |
| 2002/0163473 A1 * | 11/2002 | Koyama et al. ............ 343/718 |
| 2002/0170064 A1 | 11/2002 | Monroe et al. |
| 2003/0026240 A1 | 2/2003 | Eyuboglu et al. |
| 2003/0030588 A1 | 2/2003 | Kalis et al. |
| 2003/0038698 A1 | 2/2003 | Hirayama |
| 2003/0063591 A1 | 4/2003 | Leung et al. |
| 2003/0122714 A1 | 7/2003 | Wannagot et al. |
| 2003/0169330 A1 | 9/2003 | Ben-Shachar et al. |
| 2003/0174099 A1 * | 9/2003 | Bauer et al. ................... 343/893 |
| 2003/0184490 A1 | 10/2003 | Raiman et al. |
| 2003/0184492 A1 | 10/2003 | Chiang et al. |
| 2003/0189514 A1 | 10/2003 | Miyano et al. |
| 2003/0189521 A1 | 10/2003 | Yamamoto et al. |
| 2003/0189523 A1 | 10/2003 | Ojantakanen et al. |
| 2003/0210207 A1 | 11/2003 | Suh et al. |
| 2003/0214446 A1 | 11/2003 | Shehab |
| 2003/0227414 A1 | 12/2003 | Saliga et al. |
| 2004/0014432 A1 | 1/2004 | Boyle |
| 2004/0017310 A1 | 1/2004 | Vargas-Hurlston et al. |
| 2004/0017315 A1 | 1/2004 | Fang et al. |
| 2004/0017860 A1 | 1/2004 | Liu |
| 2004/0027291 A1 | 2/2004 | Zhang et al. |
| 2004/0027304 A1 | 2/2004 | Chiang et al. |
| 2004/0030900 A1 | 2/2004 | Clark |
| 2004/0032378 A1 | 2/2004 | Volman et al. |
| 2004/0036651 A1 | 2/2004 | Toda |
| 2004/0036654 A1 | 2/2004 | Hsieh |
| 2004/0041732 A1 | 3/2004 | Aikawa et al. |
| 2004/0048593 A1 | 3/2004 | Sano |
| 2004/0058690 A1 | 3/2004 | Ratzel et al. |
| 2004/0061653 A1 | 4/2004 | Webb et al. |
| 2004/0070543 A1 | 4/2004 | Masaki |
| 2004/0075609 A1 | 4/2004 | Li |
| 2004/0080455 A1 | 4/2004 | Lee |
| 2004/0090371 A1 | 5/2004 | Rossman |
| 2004/0095278 A1 | 5/2004 | Kanemoto et al. |
| 2004/0114535 A1 | 6/2004 | Hoffmann et al. |
| 2004/0125777 A1 | 7/2004 | Doyle et al. |
| 2004/0145528 A1 | 7/2004 | Mukai et al. |
| 2004/0153647 A1 | 8/2004 | Rotholtz et al. |
| 2004/0160376 A1 | 8/2004 | Hornsby et al. |
| 2004/0190477 A1 | 9/2004 | Olson et al. |
| 2004/0203347 A1 | 10/2004 | Nguyen |
| 2004/0207563 A1 | 10/2004 | Yang |
| 2004/0227669 A1 | 11/2004 | Okado |
| 2004/0260800 A1 | 12/2004 | Gu et al. |
| 2005/0022210 A1 | 1/2005 | Zintel et al. |
| 2005/0041739 A1 | 2/2005 | Li et al. |
| 2005/0042988 A1 | 2/2005 | Hoek et al. |
| 2005/0048934 A1 | 3/2005 | Rawnick et al. |
| 2005/0050352 A1 | 3/2005 | Narayanaswami et al. |
| 2005/0062649 A1 | 3/2005 | Chiang et al. |
| 2005/0074018 A1 | 4/2005 | Zintel et al. |
| 2005/0097503 A1 | 5/2005 | Zintel et al. |
| 2005/0122265 A1 | 6/2005 | Gaucher et al. |
| 2005/0128983 A1 | 6/2005 | Kim et al. |

(56) References Cited

U.S. PATENT DOCUMENTS

| | | |
|---|---|---|
| 2005/0128988 A1 | 6/2005 | Simpson et al. |
| 2005/0135480 A1 | 6/2005 | Li et al. |
| 2005/0138137 A1 | 6/2005 | Encarnacion et al. |
| 2005/0138193 A1 | 6/2005 | Encarnacion et al. |
| 2005/0146475 A1 | 7/2005 | Bettner et al. |
| 2005/0180381 A1 | 8/2005 | Retzer et al. |
| 2005/0184920 A1* | 8/2005 | Mahler et al. ............... 343/772 |
| 2005/0188193 A1 | 8/2005 | Kuehnel et al. |
| 2005/0237258 A1 | 10/2005 | Abramov et al. |
| 2005/0240665 A1 | 10/2005 | Gu et al. |
| 2005/0267935 A1 | 12/2005 | Gandhi et al. |
| 2006/0031922 A1 | 2/2006 | Sakai |
| 2006/0038734 A1 | 2/2006 | Shtrom et al. |
| 2006/0050005 A1 | 3/2006 | Shirosaka et al. |
| 2006/0094371 A1 | 5/2006 | Nguyen |
| 2006/0098607 A1 | 5/2006 | Zeng et al. |
| 2006/0109191 A1 | 5/2006 | Shtrom |
| 2006/0111902 A1 | 5/2006 | Julia et al. |
| 2006/0123124 A1 | 6/2006 | Weisman et al. |
| 2006/0123125 A1 | 6/2006 | Weisman et al. |
| 2006/0123455 A1 | 6/2006 | Pai et al. |
| 2006/0168159 A1 | 7/2006 | Weisman et al. |
| 2006/0184660 A1 | 8/2006 | Rao et al. |
| 2006/0184661 A1 | 8/2006 | Weisman et al. |
| 2006/0184693 A1 | 8/2006 | Rao et al. |
| 2006/0224690 A1 | 10/2006 | Falkenburg et al. |
| 2006/0225107 A1 | 10/2006 | Seetharaman et al. |
| 2006/0227062 A1 | 10/2006 | Francque et al. |
| 2006/0227761 A1 | 10/2006 | Scott, III et al. |
| 2006/0239369 A1 | 10/2006 | Lee |
| 2006/0251256 A1 | 11/2006 | Asokan et al. |
| 2006/0262015 A1 | 11/2006 | Thornell-Pers et al. |
| 2006/0291434 A1 | 12/2006 | Gu et al. |
| 2007/0027622 A1 | 2/2007 | Cleron et al. |
| 2007/0037619 A1 | 2/2007 | Matsunaga et al. |
| 2007/0055752 A1 | 3/2007 | Wiegand et al. |
| 2007/0115180 A1 | 5/2007 | Kish et al. |
| 2007/0124490 A1 | 5/2007 | Kalavade et al. |
| 2007/0130294 A1 | 6/2007 | Nishio |
| 2007/0135167 A1 | 6/2007 | Liu |
| 2008/0060064 A1 | 3/2008 | Wynn et al. |
| 2008/0062058 A1 | 3/2008 | Bishop |
| 2008/0075280 A1 | 3/2008 | Ye et al. |
| 2008/0096492 A1 | 4/2008 | Yoon |
| 2008/0109657 A1 | 5/2008 | Bajaj et al. |
| 2008/0136715 A1 | 6/2008 | Shtrom |
| 2008/0212535 A1 | 9/2008 | Karaoguz et al. |
| 2008/0272977 A1 | 11/2008 | Gaucher et al. |
| 2009/0005005 A1 | 1/2009 | Forstall et al. |
| 2009/0103731 A1 | 4/2009 | Sarikaya |
| 2009/0187970 A1 | 7/2009 | Mower et al. |
| 2009/0217048 A1 | 8/2009 | Smith |
| 2009/0219903 A1 | 9/2009 | Alamouti et al. |
| 2009/0295648 A1 | 12/2009 | Dorsey et al. |
| 2009/0315794 A1 | 12/2009 | Alamouti et al. |
| 2010/0053023 A1 | 3/2010 | Shtrom |
| 2010/0103065 A1 | 4/2010 | Shtrom et al. |
| 2010/0103066 A1 | 4/2010 | Shtrom et al. |
| 2010/0299518 A1 | 11/2010 | Viswanathan et al. |
| 2010/0332828 A1 | 12/2010 | Goto |
| 2011/0007705 A1 | 1/2011 | Buddhikot et al. |
| 2011/0040870 A1 | 2/2011 | Wynn et al. |
| 2011/0047603 A1 | 2/2011 | Gordon et al. |
| 2011/0095960 A1 | 4/2011 | Shtrom |
| 2011/0126016 A1 | 5/2011 | Sun |
| 2011/0208866 A1 | 8/2011 | Marmolejo-Meillon et al. |
| 2012/0030466 A1 | 2/2012 | Yamaguchi |
| 2012/0054338 A1 | 3/2012 | Ando |
| 2012/0089845 A1 | 4/2012 | Raleigh |
| 2012/0098730 A1 | 4/2012 | Kish |
| 2012/0134291 A1 | 5/2012 | Raleigh |
| 2012/0257536 A1 | 10/2012 | Kholaif et al. |
| 2012/0284785 A1 | 11/2012 | Salkintzis et al. |
| 2012/0299772 A1 | 11/2012 | Shtrom |
| 2012/0322035 A1 | 12/2012 | Julia et al. |
| 2013/0007853 A1 | 1/2013 | Gupta et al. |
| 2013/0038496 A1 | 2/2013 | Kish et al. |
| 2013/0047218 A1 | 2/2013 | Smith |
| 2013/0182693 A1 | 7/2013 | Sperling et al. |
| 2013/0207865 A1 | 8/2013 | Shtrom |
| 2013/0207866 A1 | 8/2013 | Shtrom |
| 2013/0207877 A1 | 8/2013 | Shtrom |
| 2013/0212656 A1 | 8/2013 | Ranade et al. |
| 2013/0269008 A1 | 10/2013 | Sheu et al. |
| 2014/0210681 A1 | 7/2014 | Shtrom |
| 2014/0282951 A1 | 9/2014 | Ranade |
| 2014/0334322 A1 | 11/2014 | Shtrom |
| 2015/0070243 A1 | 3/2015 | Kish |

FOREIGN PATENT DOCUMENTS

| | | |
|---|---|---|
| DE | 10 2006 026350 | 12/2006 |
| EP | 352 787 | 1/1990 |
| EP | 0 534 612 | 3/1993 |
| EP | 0 756 381 | 1/1997 |
| EP | 0 883 206 | 12/1998 |
| EP | 1 152 452 | 11/2001 |
| EP | 1 152 543 | 11/2001 |
| EP | 1 376 920 | 6/2002 |
| EP | 1 220 461 | 7/2002 |
| EP | 1 315 311 | 5/2003 |
| EP | 1 450 521 | 8/2004 |
| EP | 1 608 108 | 12/2005 |
| EP | 1 909 358 | 4/2008 |
| EP | 1 287 588 | 1/2009 |
| GB | 2 426 870 | 6/2006 |
| GB | 2 423 191 | 8/2006 |
| JP | 03038933 | 2/1991 |
| JP | 2008/088633 | 4/1996 |
| JP | 2001-057560 | 2/2001 |
| JP | 2002-505835 | 2/2002 |
| JP | 2005-354249 | 12/2005 |
| JP | 2006/060408 | 3/2006 |
| TW | 201351188 | 12/2013 |
| WO | WO 90/04893 | 5/1990 |
| WO | WO 99/55012 | 10/1999 |
| WO | WO 01/13461 | 2/2001 |
| WO | WO 01/69724 | 9/2001 |
| WO | WO 02/07258 A2 | 1/2002 |
| WO | WO 02/07258 A3 | 1/2002 |
| WO | WO 02/25967 | 3/2002 |
| WO | WO 03/079484 | 9/2003 |
| WO | WO 03/081718 | 10/2003 |
| WO | WO 2004/051798 | 6/2004 |
| WO | WO 2006/023247 | 3/2006 |
| WO | WO 2006/057679 | 6/2006 |
| WO | WO 2007/076105 | 7/2007 |
| WO | WO 2007/127087 | 11/2007 |
| WO | WO 2013/119750 | 8/2013 |
| WO | WO 2013/152027 | 10/2013 |

OTHER PUBLICATIONS

U.S. Appl. No. 13/396,482, Final Office Action mailed Mar. 28, 2014.
U.S. Appl. No. 13/396,484, Final Office Action mailed Apr. 11, 2014.
U.S. Appl. No. 13/439,844, Office Action mailed Apr. 22, 2014.
U.S. Appl. No. 14/242,689, filed Apr. 1, 2014, Victor Shtrom, Pattern Shaping of RF Emission Patterns.
U.S. Appl. No. 11/877,465, Office Action mailed Jul. 29, 2014.
U.S. Appl. No. 14/275,887, filed May 13, 2014, Victor Shtrom, Adjustment of Radiation Patterns Utilizing a Position Sensor.
U.S. Appl. No. 14/294,012, filed Jun. 2, 2014, Prashant Ranade, Dynamic PSK for Hotspots.
U.S. Appl. No. 13/396,482, Office Action mailed Sep. 16, 2014.
U.S. Appl. No. 14/487,593, filed Sep. 16, 2014, William Kish, Coverage Antenna Apparatus With Selectable Horizontal and Vertical Polarization Elements.
Encrypted Preshared key; cisco corp. 14 pages, 2010.
Request for Inter Partes Reexamination for U.S. Pat. No. 7,358,912, filed by Rayspan Corporation and Netgear, Inc. on Sep. 4, 2008.
Third Party Comments after Patent Owner's Response in Accordance with 37 CFR 1.947 for U.S. Pat. No. 7,358,912 (Control No. 95/001079) mailed on Jul. 17, 2009.

(56) References Cited

OTHER PUBLICATIONS

U.S. Appl. No. 95/001,078, filed Sep. 4, 2008, Shtrom et al. (Re-Exam).
U.S. Appl. No. 95/001,079, filed Sep. 4, 2008, Shtrom et al. (Re-Exam).
PCT Application No. PCT/US2005/027169, International Search Report and Written Opinion mailed Aug. 10, 2006.
PCT Application No. PCT/US2013/34997, International Search Report mailed Jun. 17, 2013.
Chinese Application No. 20058001532.6, Office Action dated Jun. 23, 2011.
Chinese Application No. 200910258884.X, Office Action dated Apr. 15, 2013.
Taiwan Application No. 094127953, Office Action dated Aug. 16, 2011.
U.S. Appl. No. 11/877,465, Final Office Action mailed May 16, 2013.
U.S. Appl. No. 11/877,465, Office Action mailed Oct. 3, 2012.
U.S. Appl. No. 11/877,465, Final Office Action mailed Jun. 20, 2012.
U.S. Appl. No. 11/877,465, Office Action mailed Sep. 19, 2011.
U.S. Appl. No. 11/877,465, Final Office Action mailed Dec. 9, 2010.
U.S. Appl. No. 11/877,465, Office Action mailed Apr. 12, 2010.
U.S. Appl. No. 12/980,253, Final Office Action mailed Jun. 6, 2013.
U.S. Appl. No. 12/980,253, Office Action mailed Aug. 17, 2012.
U.S. Appl. No. 12/980,253, Office Action mailed Sep. 13, 2011.
U.S. Appl. No. 12/980,253, Office Action mailed Mar. 1, 2011.
U.S. Appl. No. 12/425,374, Office Action mailed Jul. 6, 2010.
U.S. Appl. No. 13/653,405, Office Action mailed Dec. 19, 2012.
U.S. Appl. No. 12/953,324, Office Action mailed Mar. 24, 2011.
U.S. Appl. No. 13/731,273, Office Action mailed May 23, 2013.
U.S. Appl. No. 13/396,482, Office Action mailed Oct. 18, 2013.
U.S. Appl. No. 13/396,484, Office Action mailed Oct. 11, 2013.
U.S. Appl. No. 13/439,844, Final Office Action mailed Oct. 28, 2013.
U.S. Appl. No. 13/439,844, Office Action mailed Jun. 5, 2013.
ACM Digital Library, "Hotspots Shared Keys" ACM, Inc. 2014. Date of download: Nov. 24, 2014.
Google, "Hotspots pre-shared keys". Date of download: Nov. 24, 2014.
IEEE Xplore Digital Library "Hotspots shared keys". Date of download: Nov. 24, 2014.
PCT Application No. PCT/US2013/34997, Written Opinion mailed Jun. 17, 2013 (Date of Online Publication: Oct. 4, 2014).
Abramov 2003—P.R. 3-3 © Chart for U.S. Pat. No. 7,525,486 and U.S. Pat. No. 7,193,562.
Abramov 273—P.R. 3-3 © Chart for U.S. Pat. No. 7,525,486 and U.S. Pat. No. 7,193,562.
Abramov 296—P.R. 3-3 © Chart for U.S. Pat. No. 7,525,486 and U.S. Pat. No. 7,193,562.
Airgain 2004—P.R. 3-3 © Chart for U.S. Pat. No. 7,525,486 and U.S. Pat. No. 7,193,562.
Alard, M., et al., "Principles of Modulation and Channel Coding for Digital Broadcasting for Mobile Receivers," 8301 EBU Review Technical, Aug. 1987, No. 224, Brussels, Belgium.
Ando et al., "Study of Dual-Polarized Omni-Directional Antennas for 5.2 GHz-Band 2×2 MIMO-OFDM Systems," Antennas and Propogation Society International Symposium, 2004, IEEE, pp. 1740-1743 vol. 2.
Areg Alimian et al., "Analysis of Roaming Techniques," doc.:IEEE 802.11-04/0377r1, Submission, Mar. 2004.
"Authorization of Spread Spectrum Systems Under Parts 15 and 90 of the FCC Rules and Regulations," Rules and Regulations Federal Communications Commission, 47 CFR Part 2, 15, and 90, Jun. 18, 1985.
"Authorization of spread spectrum and other wideband emissions not presently provided for in the FCC Rules and Regulations," Before the Federal Communications Commission, FCC 81-289, 87 F.C.C.2d 876, Jun. 30, 1981.
Bancroft 863—P.R. 3-3 © Chart for U.S. Pat. No. 7,525,486 and U.S. Pat. No. 7,193,562.
Barabash 059—P.R. 3-3 © Chart for U.S. Pat. No. 7,525,486 and U.S. Pat. No. 7,193,562.
Bedell, Paul, "Wireless Crash Course," 2005, p. 84, The McGraw-Hill Companies, Inc., USA.
Behdad et al., Slot Antenna Miniaturization Using Distributed Inductive Loading, Antenna and Propagation Society International Symposium, 2003 IEEE, vol. 1, pp. 308-311 (Jun. 2003).
Berenguer, Inaki, et al., "Adaptive MIMO Antenna Selection," Nov. 2003.
Casas, Eduardo F., et al., "OFDM for Data Communication Over Mobile Radio FM Channels—Part I: Analysis and Experimental Results," IEEE Transactions on Communications, vol. 39, No. 5, May 1991, pp. 783-793.
Casas, Eduardo F., et al., "OFDM for Data Communication over Mobile Radio FM Channels; Part II: Performance Improvement," Department of Electrical Engineering, University of British Columbia.
Cetiner 2003—P.R. 3-3 © Chart for U.S. Pat. No. 7,525,486 and U.S. Pat. No. 7,193,562.
Chang, Nicholas B. et al., "Optimal Channel Probing and Transmission Scheduling for Opportunistics Spectrum Access," Sep. 2007.
Chang, Robert W., et al., "A Theoretical Study of Performance of an Orthogonal Multiplexing Data Transmission Scheme," IEEE Transactions on Communication Technology, vol. Com-16, No. 4, Aug. 1968, pp. 529-540.
Chang, Robert W., "Synthesis of Band-Limited Orthogonal Signals for Multichannel Data Transmission," The Bell System Technical Journal, Dec. 1966, pp. 1775-1796.C.
Chuang et al., A 2.4 GHz Polarization-diversity Planar Printed Dipole Antenna for WLAN and Wireless Communication Applications, Microwave Journal, vol. 45, No. 6, pp. 50-62 (Jun. 2002).
Chuang 2003—P.R. 3-3 © Chart for U.S. Pat. No. 7,525,486 and U.S. Pat. No. 7,193,562.
Cimini, Jr., Leonard J, "Analysis and Simulation of a Digital Mobile Channel Using Orthogonal Frequency Division Multiplexing," IEEE Transactions on Communications, vol. Com-33, No. 7, Jul. 1985, pp. 665-675.
Cisco Systems, "Cisco Aironet Access Point Software Configuration Guide: Configuring Filters and Quality of Service," Aug. 2003.
Dell Inc., "How Much Broadcast and Multicast Traffic Should I Allow in My Network," PowerConnect Application Note #5, Nov. 2003.
Dutta, Ashutosh et al., "MarconiNet Supporting Streaming Media Over Localized Wireless Multicast," Proc. of the 2d Int'l Workshop on Mobile Commerce, 2002.
Dunkels, Adam et al., "Making TCP/IP Viable for Wireless Sensor Networks," Proc. of the 1st Euro. Workshop on Wireless Sensor Networks, Berlin, Jan. 2004.
Dunkels, Adam et al., "Connecting Wireless Sensornets with TCP/IP Networks," Proc. of the 2d Int'l Conf. on Wired Networks, Frankfurt, Feb. 2004.
English Translation of PCT Pub. No. WO2004/051798 (as filed US National Stage U.S. Appl. No. 10/536,547).
Evans 864—P.R. 3-3 © Chart for U.S. Pat. No. 7,525,486.
Festag, Andreas, "What is Mombasa?" Telecommunication Networks Group (TKN), Technical University of Berlin, Mar. 7, 2002.
Frederick et al., Smart Antennas Based on Spatial Multiplexing of Local Elements (SMILE) for Mutual Coupling Reduction, IEEE Transactions of Antennas and Propogation, vol. 52., No. 1, pp. 106-114 (Jan. 2004).
Gaur, Sudhanshu, et al., "Transmit/Receive Antenna Selection for MIMO Systems to Improve Error Performance of Linear Receivers," School of ECE, Georgia Institute of Technology, Apr. 4, 2005.
Gledhill, J. J., et al., "The Transmission of Digital Television in the UHF Band Using Orthogonal Frequency Division Multiplexing," Sixth International Conference on Digital Processing of Signals in Communications, Sep. 2-6, 1991, pp. 175-180.
Golmie, Nada, "Coexistence in Wireless Networks: Challenges and System-Level Solutions in the Unlicensed Bands," Cambridge University Press, 2006.
Hewlett Packard, "HP ProCurve Networking: Enterprise Wireless LAN Networking and Mobility Solutions," 2003.
Hirayama, Koji et al., "Next-Generation Mobile-Access IP Network," Hitachi Review vol. 49, No. 4, 2000.

(56) References Cited

OTHER PUBLICATIONS

Ian F. Akyildiz, et al., "A Virtual Topology Based Routing Protocol for Multihop Dynamic Wireless Networks," Broadband and Wireless Networking Lab, School of Electrical and Computer Engineering, Georgia Institute of Technology.

Information Society Technologies Ultrawaves, "System Concept / Architecture Design and Communication Stack Requirement Document," Feb. 23, 2004.

Johnson 404—P.R. 3-3 © Chart for U.S. Pat. No. 7,525,486 and U.S. Pat. No. 7,193,562.

Kalis 2000—P.R. 3-3 © Chart for U.S. Pat. No. 7,525,486 and U.S. Pat. No. 7,193,562.

Kalis 2002—P.R. 3-3 © Chart for U.S. Pat. No. 7,525,486.

Kaluzni 717—P.R. 3-3 © Chart for U.S. Pat. No. 7,525,486 and U.S. Pat. No. 7,193,562.

Ken Tang, et al., "MAC Layer Broadcast Support in 802.11 Wireless Networks," Computer Science Department, University of California, Los Angeles, 2000 IEEE, pp. 544-548.

Ken Tang, et al., "MAC Reliable Broadcast in Ad Hoc Networks," Computer Science Department, University of California, Los Angeles, 2001 IEEE, pp. 1008-1013.

Kim 693—P.R. 3-3 © Chart for U.S. Pat. No. 7,525,486 and U.S. Pat. No. 7,193,562.

Lin 836—P.R. 3-3 © Chart for U.S. Pat. No. 7,525,486 and U.S. Pat. No. 7,193,562.

Mawa, Rakesh, "Power Control in 3G Systems," Hughes Systique Corporation, Jun. 28, 2006.

Microsoft Corporation, "IEEE 802.11 Networks and Windows XP," Windows Hardware Developer Central, Dec. 4, 2001.

Molisch, Andreas F., et al., "MIMO Systems with Antenna Selection—an Overview," Draft, Dec. 31, 2003.

Moose, Paul H., "Differential Modulation and Demodulation of Multi-Frequency Digital Communications Signals," 1990 IEEE,CH2831-6/90/0000-0273.

Nakao 762—P.R. 3-3 © Chart for U.S. Pat. No. 7,525,486.

Okada 201—P.R. 3-3 © Chart for U.S. Pat. No. 7,525,486 and U.S. Pat. No. 7,193,562.

ORINOCO AP-2000 5GHz Kit, "Access Point Family," Proxim Wireless Corporation.

Palmer 773—P.R. 3-3 © Chart for U.S. Pat. No. 7,525,486 and U.S. Pat. No. 7,193,562.

Pat Calhoun et al., "802.11r strengthens wireless voice," Technology Update, Network World, Aug. 22, 2005, http://www.networkworld.com/news/tech/2005/082208techupdate.html.

Press Release, Netgear RangeMax(TM) Wireless Networking Solutions Incorporate Smart MIMO Technology to Eliminate Wireless Dead Spots and Take Consumers Farther, Ruckus Wireles Inc. (Mar. 7, 2005), available at http://ruckuswireless.com/press/releases/20050307.php.

Paun 749—P.R. 3-3 © Chart for U.S. Pat. No. 7,525,486 and U.S. Pat. No. 7,193,562.

Qian 2000—P.R. 3-3 © Chart for U.S. Pat. No. 7,525,486 and U.S. Pat. No. 7,193,562.

RL Miller, "4.3 Project X—A True Secrecy System for Speech," Engineering and Science in the Bell System, A History of Engineering and Science in the Bell System National Service in War and Peace (1925-1975), pp. 296-317, 1978, Bell Telephone Laboratories, Inc.

*Ruckus Wireless, Inc.* vs. *Netgear, Inc*; Defendant Netgear, Inc. Invalidity Contentions.

Sadek, Mirette, et al., "Active Antenna Selection in Multiuser MIMO Communications," IEEE Transactions on Signal Processing, vol. 55, No. 4, Apr. 2007, pp. 1498-1510.

Saltzberg, Burton R., "Performance of an Efficient Parallel Data Transmission System," IEEE Transactions on Communication Technology, vol. Com-15, No. 6, Dec. 1967, pp. 805-811.

Shehab 2003—P.R. 3-3 © Chart for U.S. Pat. No. 7,525,486 and U.S. Pat. No. 7,193,562.

Shirosaka 907—P.R. 3-3 © Chart for U.S. Pat. No. 7,525,486 and U.S. Pat. No. 7,193,562.

Shtrom 198 & 280—P.R. 3-3 © Chart for U.S. Pat. No. 7,525,486 and U.S. Pat. No. 7,193,562.

Sievenpiper 254—P.R. 3-3 © Chart for U.S. Pat. No. 7,525,486 and U.S. Pat. No. 7,193,562.

Simons 1994—P.R. 3-3 © Chart for U.S. Pat. No. 7,525,486 and U.S. Pat. No. 7,193,562.

Steger, Christopher et al., "Performance of IEEE 802.11b Wireless LAN in an Emulated Mobile Channel," 2003.

Sward 643—P.R. 3-3 © Chart for U.S. Pat. No. 7,525,486 and U.S. Pat. No. 7,193,562.

Toskala, Antti, "Enhancement of Broadcast and Introduction of Multicast Capabilities in RAN," Nokia Networks, Palm Springs, California, Mar. 13-16, 2001.

Tsunekawa, Kouichi, "Diversity Antennas for Portable Telephones," 39th IEEE Vehicular Technology Conference, pp. 50-56, vol. I, Gateway to New Concepts in Vehicular Technology, May 1-3, 1989, San Francisco, CA.

Varnes et al., A Switched Radial Divider for an L-Band Mobile Satellite Antenna, European Microwave Conference (Oct. 1995), pp. 1037-1041.

Vaughan 1995—P.R. 3-3 © Chart for U.S. Pat. No. 7,525,486 and U.S. Pat. No. 7,193,562.

Vincent D. Park, et al., "A Performance Comparison of the Temporally-Ordered Routing Algorithm and Ideal Link-State Routing," IEEE, Jul. 1998, pp. 592-598.

Wang 703—P.R. 3-3 © Chart for U.S. Pat. No. 7,525,486 and U.S. Pat. No. 7,193,562.

W.E. Doherty, Jr. et al., The Pin Diode Circuit Designer's Handbook (1998).

Weinstein, S. B., et al., "Data Transmission by Frequency-Division Multiplexing Using the Discrete Fourier Transform," IEEE Transactions on Communication Technology, vol. Com-19, No. 5, Oct. 1971, pp. 628-634.

Wennstrom, Mattias et al., "Transmit Antenna Diversity in Ricean Fading MIMO Channels with Co-Channel Interference," 2001.

Petition Decision Denying Request to Order Additional Claims for U.S. Pat. No. 7,193,562 (Control No. 95/001078) mailed on Jul. 10, 2009.

Right of Appeal Notice for U.S. Pat. No. 7,193,562 (Control No. 95/001078) mailed on Jul. 10, 2009.

European Examination Report for EP Application No. 05776697.4 mailed Jan. 21, 2011.

European Second Examination Report for EP Application No. 07775498.4 dated Mar. 12, 2013.

European Third Examination Report for EP Application No. 07775498.4 dated Oct. 17, 2011.

European First Examination Report for EP Application No. 09014989.9 dated May 7, 2012.

Supplementary European Search Report for EP Application No. EP05776697.4 dated Jul. 10, 2009.

Supplementary European Search Report for EP Application No. EP07755519 dated Mar. 11, 2009.

PCT Application No. PCT/US2005/27023, International Search Report and Written Opinion mailed Dec. 23, 2005.

PCT Application No. PCT/US2006/49211, International Search Report and Written Opinion mailed Aug. 29, 2008.

PCT Application No. PCT/US2007/09276, International Search Report and Written Opinion mailed Aug. 11, 2008.

Chinese Application No. 200680048001.7, Office Action dated Jun. 20, 2012.

Chinese Application No. 200780020943.9, Office Action dated Feb. 7, 2013.

Chinese Application No. 200780020943.9, Office Action dated Aug. 29, 2012.

Chinese Application No. 200780020943.9, Office Action dated Dec. 19, 2011.

Chinese Application No. 200910258884.X, Office Action dated Aug. 3, 2012.

Taiwan Application No. 094127953, Office Action dated Mar. 20, 2012.

Taiwan Application No. 096114265, Office Action dated Jun. 20, 2011.

U.S. Appl. No. 11/010,076, Office Action mailed Oct. 31, 2006.

(56) References Cited

OTHER PUBLICATIONS

U.S. Appl. No. 11/010,076, Final Office Action mailed Aug. 8, 2006.
U.S. Appl. No. 11/010,076, Office Action mailed Dec. 23, 2006.
U.S. Appl. No. 11/022,080, Office Action mailed Jul. 21, 2006.
U.S. Appl. No. 11/041,145, Final Office Action mailed Jan. 29, 2007.
U.S. Appl. No. 11/041,145, Office Action mailed Jul. 21, 2006.
U.S. Appl. No. 11/265,751, Office Action mailed Mar. 18, 2008.
U.S. Appl. No. 11/413,461, Office Action mailed Jun. 7, 2007.
U.S. Appl. No. 11/714,707, Final Office Action mailed May 30, 2008.
U.S. Appl. No. 11/714,707, Office Action mailed Oct. 15, 2007.
U.S. Appl. No. 11/924,082, Office Action mailed Aug. 29, 2008.
U.S. Appl. No. 12/082,090, Office Action mailed Jan. 18, 2011.
U.S. Appl. No. 12/404,124, Final Office Action mailed Feb. 7, 2012.
U.S. Appl. No. 12/404,124, Office Action mailed Sep. 19, 2011.
U.S. Appl. No. 13/280,278, Office Action mailed Mar. 25, 2013.
U.S. Appl. No. 13/280,278, Final Office Action mailed Aug. 22, 2012.
U.S. Appl. No. 13/280,278, Office Action mailed Feb. 21, 2012.
U.S. Appl. No. 13/305,609, Final Office Action mailed Jul. 3, 2012.
U.S. Appl. No. 13/305,609, Office Action mailed Dec. 20, 2011.
U.S. Appl. No. 13/370,201, Office Action mailed May 13, 2013.
U.S. Appl. No. 13/485,012, Final Office Action mailed Mar. 3, 2013.
U.S. Appl. No. 13/485,012, Office Action mailed Oct. 25, 2012.
U.S. Appl. No. 12/980,253, Final Office Action mailed Jan. 23, 2015.
U.S. Appl. No. 13/396,482, Final Office Action mailed Jan. 22, 2015.
U.S. Appl. No. 13/396,484, Office Action mailed Jan. 21, 2015.
Bargh et al., "Fast Authentication Methods for Handovers between IEEE 802.11 Wireless LANs", Proceedings of the ACM International Workshop on Wireless Mobile Applications and Services on WLAN Hotspots. Oct. 1, 2004.
Kassab et al., "Fast Pre-Authentication Based on Proactive Key Distribution for 802.11 Infrastructure Networks", WMuNeP'05, Oct. 13, 2005, Montreal, Quebec, Canada, Copyright 2005 ACM.
European Second Examination Report for EP Application No. 09014989.9 dated Dec. 13, 2013.
Taiwan Application No. 094141018, Office Action dated May 8, 2013.
U.S. Appl. No. 13/653,405, Office Action mailed Dec. 19, 2013.
U.S. Appl. No. 12/980,253, Office Action mailed Sep. 28, 2015.
U.S. Appl. No. 13/396,482, Office Action mailed Aug. 20, 2015.
U.S. Appl. No. 13/396,484, Final Office Action mailed Aug. 20, 2015.

* cited by examiner

ANTENNA ARRAY

CROSS-REFERENCE TO RELATED APPLICATIONS

The present application is a continuation claims the priority benefit of U.S. patent application Ser. No. 12/425,374 filed Apr. 16, 2009, which is a continuation and claims the priority benefit of U.S. patent application Ser. No. 11/714,707 filed Mar. 5, 2007, now U.S. Pat. No. 7,525,486, which is a continuation and claims the priority benefit of U.S. patent application Ser. No. 11/022,080 filed December 23, 2004, now U.S. Pat. No. 7,193,562, which claims priority benefit of U.S. provisional application number 60/630,499 filed Nov. 22, 2004, the disclosures of which are incorporated herein by reference.

BACKGROUND OF THE INVENTION

1. Field of the Invention

The present invention relates generally to wireless communications, and more particularly to a circuit board having a peripheral antenna apparatus with selectable antenna elements.

2. Description of the Related Art

In communications systems, there is an ever-increasing demand for higher data throughput and a corresponding drive to reduce interference that can disrupt data communications. For example, in an IEEE 802.11 network, an access point (i.e., base station) communicates data with one or more remote receiving nodes (e.g., a network interface card) over a wireless link. The wireless link may be susceptible to interference from other access points, other radio transmitting devices, changes or disturbances in the wireless link environment between the access point and the remote receiving node, and so on. The interference may be such to degrade the wireless link, for example by forcing communication at a lower data rate, or may be sufficiently strong to completely disrupt the wireless link.

One solution for reducing interference in the wireless link between the access point and the remote receiving node is to provide several omnidirectional antennas for the access point, in a "diversity" scheme. For example, a common configuration for the access point comprises a data source coupled via a switching network to two or more physically separated omnidirectional antennas. The access point may select one of the omnidirectional antennas by which to maintain the wireless link. Because of the separation between the omnidirectional antennas, each antenna experiences a different signal environment, and each antenna contributes a different interference level to the wireless link. The switching network couples the data source to whichever of the omnidirectional antennas experiences the least interference in the wireless link.

However, one limitation with using two or more omnidirectional antennas for the access point is that each omnidirectional antenna comprises a separate unit of manufacture with respect to the access point, thus requiring extra manufacturing steps to include the omnidirectional antennas in the access point. A further limitation is that the omnidirectional antenna typically comprises an upright wand attached to a housing of the access point. The wand typically comprises a rod exposed outside of the housing, and may be subject to breakage or damage.

Another limitation is that typical omnidirectional antennas are vertically polarized. Vertically polarized radio frequency (RF) energy does not travel as efficiently as horizontally polarized RF energy inside a typical office or dwelling space, additionally, most laptop computer network interface cards have horizontally polarized antennas. Typical solutions for creating horizontally polarized RF antennas to date have been expensive to manufacture, or do not provide adequate RF performance to be commercially successful.

A still further limitation with the two or more omnidirectional antennas is that because the physically separated antennas may still be relatively close to each other, each of the several antennas may experience similar levels of interference and only a relatively small reduction in interference may be gained by switching from one omnidirectional antenna to another omnidirectional antenna.

SUMMARY OF THE PRESENTLY CLAIMED INVENTION

An exemplary embodiment of the present invention includes an antenna array.

BRIEF DESCRIPTION OF THE DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

A system for a wireless (i.e., radio frequency or RF) link to a remote receiving device includes a circuit board comprising communication circuitry for generating an RF signal and an antenna apparatus for transmitting and/or receiving the RF signal. The antenna apparatus includes two or more antenna elements arranged near the periphery of the circuit board. Each of the antenna elements provides a directional radiation pattern. In some embodiments, the antenna elements may be electrically selected (e.g., switched on or off) so that the antenna apparatus may form configurable radiation patterns. If multiple antenna elements are switched on, the antenna apparatus may form an omnidirectional radiation pattern.

Advantageously, the circuit board interconnects the communication circuitry and provides the antenna apparatus in one easily manufacturable printed circuit board. Including the antenna apparatus in the printed circuit board reduces the cost to manufacture the circuit board and simplifies interconnection with the communication circuitry. Further, including the antenna apparatus in the circuit board provides more consistent RF matching between the communication circuitry and the antenna elements. A further advantage is that the antenna apparatus radiates directional radiation patterns substantially in the plane of the antenna elements. When mounted horizontally, the radiation patterns are horizontally polarized, so that RF signal transmission indoors is enhanced as compared to a vertically polarized antenna.

Figure 1:
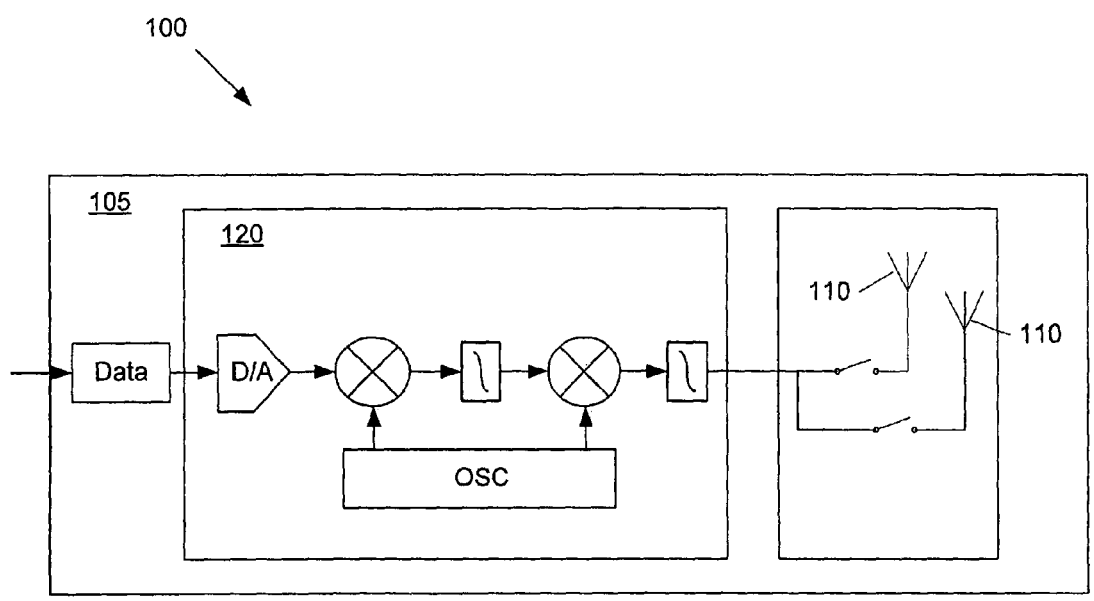
FIG. 1 illustrates an exemplary schematic for a system incorporating a circuit board having a peripheral antenna apparatus with selectable elements, in one embodiment in accordance with the present invention.

FIG. 1 illustrates an exemplary schematic for a system 100 incorporating a circuit board having a peripheral antenna apparatus with selectable elements, in one embodiment in accordance with the present invention. The system 100 may comprise, for example without limitation, a transmitter/receiver such as an 802.11 access point, an 802.11 receiver, a set-top box, a laptop computer, a television, a cellular telephone, a cordless telephone, a wireless VoIP phone, a remote control, and a remote terminal such as a handheld gaming device. In some exemplary embodiments, the system 100 comprises an access point for communicating to one or more remote receiving nodes over a wireless link, for example in an 802.11 wireless network.

The system 100 comprises a circuit board 105 including a radio modulator/demodulator (modem) 120 and a peripheral antenna apparatus 110. The radio modem 120 may receive data from a router connected to the Internet (not shown), convert the data into a modulated RF signal, and the antenna apparatus 110 may transmit the modulated RF signal wirelessly to one or more remote receiving nodes (not shown). The system 100 may also form a part of a wireless local area network by enabling communications among several remote receiving nodes. Although the disclosure will focus on a specific embodiment for the system 100 including the circuit board 105, aspects of the invention are applicable to a wide variety of appliances, and are not intended to be limited to the disclosed embodiment. For example, although the system 100 may be described as transmitting to a remote receiving node via the antenna apparatus 110, the system 100 may also receive RF-modulated data from the remote receiving node via the antenna apparatus 110.

Figure 2:
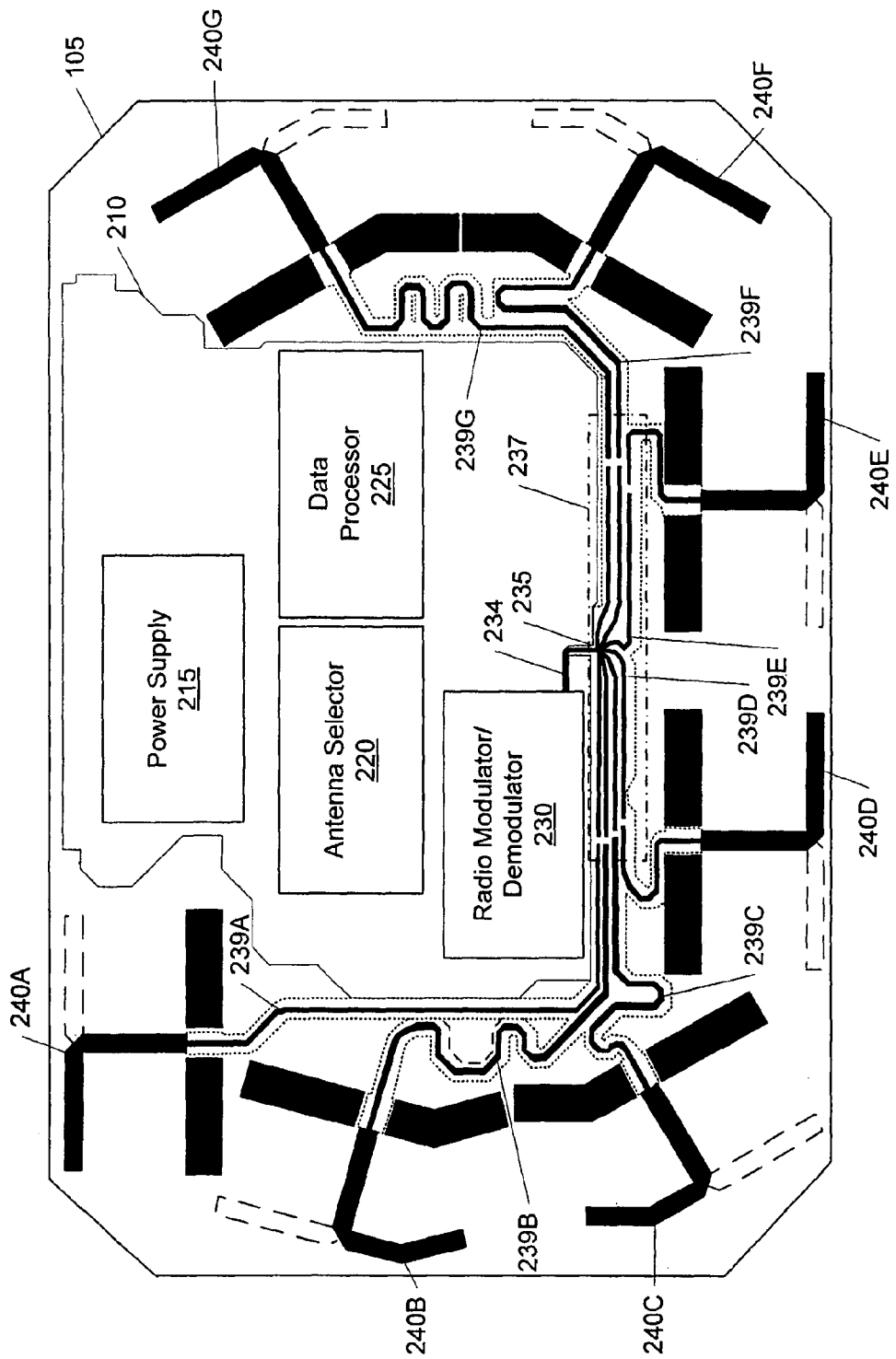
FIG. 2 illustrates the circuit board having the peripheral antenna apparatus with selectable elements of FIG. 1, in one embodiment in accordance with the present invention.

FIG. 2 illustrates the circuit board 105 having the peripheral antenna apparatus 110 with selectable elements of FIG. 1, in one embodiment in accordance with the present invention. In some embodiments, the circuit board 105 comprises a printed circuit board (PCB) such as FR4, Rogers 4003, or other dielectric material with four layers, although any number of layers is comprehended, such as six.

The circuit board 105 includes an area 210 for interconnecting circuitry including for example a power supply 215, an antenna selector 220, a data processor 225, and a radio modulator/demodulator (modem) 230. In some embodiments, the data processor 225 comprises well-known circuitry for receiving data packets from a router connected to the Internet (e.g., via a local area network). The radio modem 230 comprises communication circuitry including virtually any device for converting the data packets processed by the data processor 225 into a modulated RF signal for transmission to one or more of the remote receiving nodes, and for reception therefrom. In some embodiments, the radio modem 230 comprises circuitry for converting the data packets into an 802.11 compliant modulated RF signal.

From the radio modem 230, the circuit board 105 also includes a microstrip RF line 234 for routing the modulated RF signal to an antenna feed port 235. Although not shown, in some embodiments, an antenna feed port 235 is configured to distribute the modulated RF signal directly to antenna elements 240A-240G of the peripheral antenna apparatus 110 (not labeled) by way of antenna feed lines. In the embodiment depicted in FIG. 2, the antenna feed port 235 is configured to distribute the modulated RF signal to one or more of the selectable antenna elements 240A-240G by way of a switching network 237 and microstrip feed lines 239A-239G. Although described as microstrip, the feed lines 239 may also comprise coupled microstrip, coplanar strips with impedance transformers, coplanar waveguide, coupled strips, and the like.

The antenna feed port 235, the switching network 237, and the feed lines 239 comprise switching and routing components on the circuit board 105 for routing the modulated RF signal to the antenna elements 240A-240G. As described further herein, the antenna feed port 235, the switching network 237, and the feed lines 239 include structures for impedance matching between the radio modem 230 and the antenna elements 240. The antenna feed port 235, the switching network 237, and the feed lines 239 are further described with respect to FIG. 5.

As described further herein, the peripheral antenna apparatus comprises a plurality of antenna elements 240A-240G located near peripheral areas of the circuit board 105. Each of the antenna elements 240 produces a directional radiation pattern with gain (as compared to an omnidirectional antenna) and with polarization substantially in the plane of the circuit board 105. Each of the antenna elements may be arranged in an offset direction from the other antenna elements 240 so that the directional radiation pattern produced by one antenna element (e.g., the antenna element 240A) is offset in direction from the directional radiation pattern produced by another antenna element (e.g., the antenna element 240C). Certain antenna elements may also be arranged in substantially the same direction, such as the antenna elements 240D and 240E. Arranging two or more of the antenna elements 240 in the same direction provides spatial diversity between the antenna elements 240 so arranged.

In embodiments with the switching network 237, selecting various combinations of the antenna elements 240 produces various radiation patterns ranging from highly directional to omnidirectional. Generally, enabling adjacent antenna elements 240 results in higher directionality in azimuth as compared to selecting either of the antenna elements 240 alone. For example, selecting the adjacent antenna elements 240A and 240B may provide higher directionality than selecting either of the antenna elements 240A or 240B alone. Alternatively, selecting every other antenna element (e.g., the antenna elements 240A, 240C, 240E, and 240G) or all of the antenna elements 240 may produce an omnidirectional radiation pattern.

The operating principle of the selectable antenna elements 240 may be further understood by review of co-pending U.S. patent application Ser. No. 11/010,076, entitled "System and Method for an Omnidirectional Planar Antenna Apparatus with Selectable Elements," filed Dec. 9, 2004, and previously incorporated herein by reference.

Figure 3A:
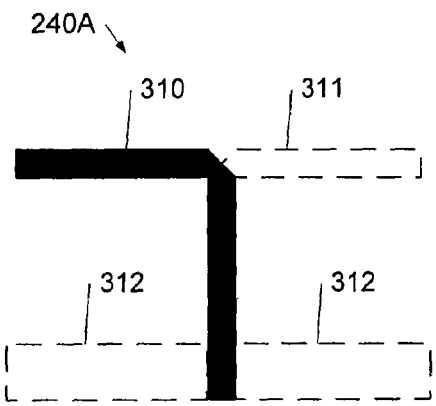
FIG. 3A illustrates a modified dipole for the antenna apparatus of FIG. 2, in one embodiment in accordance with the present invention.

FIG. 3A illustrates the antenna element 240A of FIG. 2, in one embodiment in accordance with the present invention. The antenna element 240A of this embodiment comprises a modified dipole with components on both exterior surfaces of the circuit board 105 (considered as the plane of FIG. 3A). Specifically, on a first surface of the circuit board 105, the antenna element 240A includes a first dipole component 310. On a second surface of the circuit board 105, depicted by dashed lines in FIG. 3, the antenna element 240A includes a second dipole component 311 extending substantially opposite from the first dipole component 310. The first dipole component 310 and the second dipole component 311 form the antenna element 240A to produce a generally cardioid directional radiation pattern substantially in the plane of the circuit board.

In some embodiments, such as the antenna elements 240B and 240C of FIG. 2, the dipole component 310 and/or the dipole component 311 may be bent to conform to an edge of the circuit board 105. Incorporating the bend in the dipole component 310 and/or the dipole component 311 may reduce the size of the circuit board 105. Although described as being formed on the surface of the circuit board 105, in some embodiments the dipole components 310 and 311 are formed on interior layers of the circuit board, as described herein.

The antenna element 240A may optionally include one or more reflectors (e.g., the reflector 312). The reflector 312 comprises elements that may be configured to concentrate the directional radiation pattern formed by the first dipole component 310 and the second dipole component 311. The reflector 312 may also be configured to broaden the frequency response of the antenna component 240A. In some embodiments, the reflector 312 broadens the frequency response of each modified dipole to about 300 MHz to 500 MHz. In some embodiments, the combined operational bandwidth of the antenna apparatus resulting from coupling more than one of the antenna elements 240 to the antenna feed port 235 is less than the bandwidth resulting from coupling only one of the antenna elements 240 to the antenna feed port 235. For example, with four antenna elements 240 (e.g., the antenna elements 240A, 240C, 240E, and 240G) selected to result in an omnidirectional radiation pattern, the combined frequency response of the antenna apparatus is about 90 MHz. In some embodiments, coupling more than one of the antenna elements 240 to the antenna feed port 235 maintains a match with less than 10 dB return loss over 802.11 wireless LAN frequencies, regardless of the number of antenna elements 240 that are switched on.

Figure 3B:
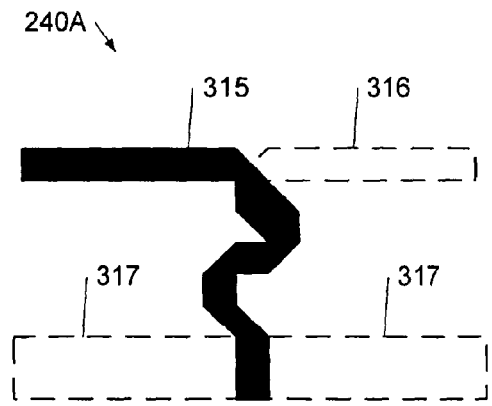
FIG. 3B illustrates a size reduced modified dipole for the antenna apparatus of FIG. 2, in an alternative embodiment in accordance with the present invention.

FIG. 3B illustrates the antenna element 240A of FIG. 2, in an alternative embodiment in accordance with the present invention. The antenna element 240A of this embodiment may be reduced in dimension as compared to the antenna element 240A of FIG. 3A. Specifically, the antenna element 240A of this embodiment comprises a first dipole component 315 incorporating a meander, a second dipole component 316 incorporating a corresponding meander, and a reflector 317. Because of the meander, the antenna element 240A of this embodiment may require less space on the circuit board 105 as compared to the antenna element 240A of FIG. 3A.

Figure 3C:
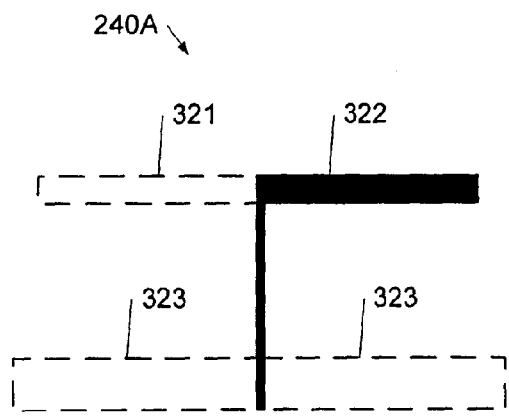
FIG. 3C illustrates an alternative modified dipole for the antenna apparatus of FIG. 2, in an alternative embodiment in accordance with the present invention.

FIG. 3C illustrates the antenna element 240A of FIG. 2, in an alternative embodiment in accordance with the present invention. The antenna element 240A of this embodiment includes one or more components on one or more layers internal to the circuit board 105. Specifically, in one embodiment, a first dipole component 321 is formed on an internal ground plane of the circuit board 105. A second dipole component 322 is formed on an exterior surface of the circuit board 105. As described further with respect to FIG. 4, a reflector 323 may be formed internal to the circuit board 105, or may be formed on the exterior surface of the circuit board 105. An advantage of this embodiment of the antenna element 240A is that vias through the circuit board 105 may be reduced or eliminated, making the antenna element 240A of this embodiment less expensive to manufacture.

Figure 3D:
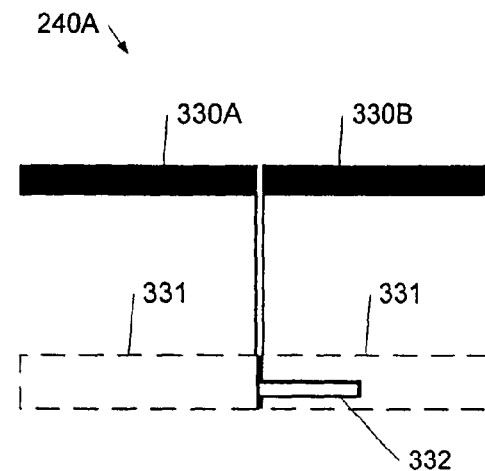
FIG. 3D illustrates a modified dipole with coplanar strip transition for the antenna apparatus of FIG. 2, in an alternative embodiment in accordance with the present invention.

FIG. 3D illustrates the antenna element 240A of FIG. 2, in an alternative embodiment in accordance with the present invention. The antenna element 240A of this embodiment includes a modified dipole with a microstrip to coplanar strip (CPS) transition 332 and CPS dipole arms 330A and 330B on a surface layer of the circuit board 105. Specifically, this embodiment provides that the CPS dipole arm 330A may be coplanar with the CPS dipole arm 330B, and may be formed on the same surface of the circuit board 105. This embodiment may also include a reflector 331 formed on one or more interior layers of the circuit board 105 or on the opposite surface of the circuit board 105. An advantage of this embodiment is that no vias are needed in the circuit board 105.

It will be appreciated that the dimensions of the individual components of the antenna elements 240A-G (e.g., the first dipole component 310, the second dipole component 311, and the reflector 312) depend upon a desired operating frequency of the antenna apparatus. Furthermore, it will be appreciated that the dimensions of wavelength depend upon conductive and dielectric materials comprising the circuit board 105, because speed of electron propagation depends upon the properties of the circuit board 105 material. Therefore, dimensions of wavelength referred to herein are intended specifically to incorporate properties of the circuit board, including considerations such as the conductive and dielectric properties of the circuit board 105. The dimensions of the individual components may be established by use of RF simulation software, such as IE3D from Zeland Software of Fremont, Calif.

Figure 4:
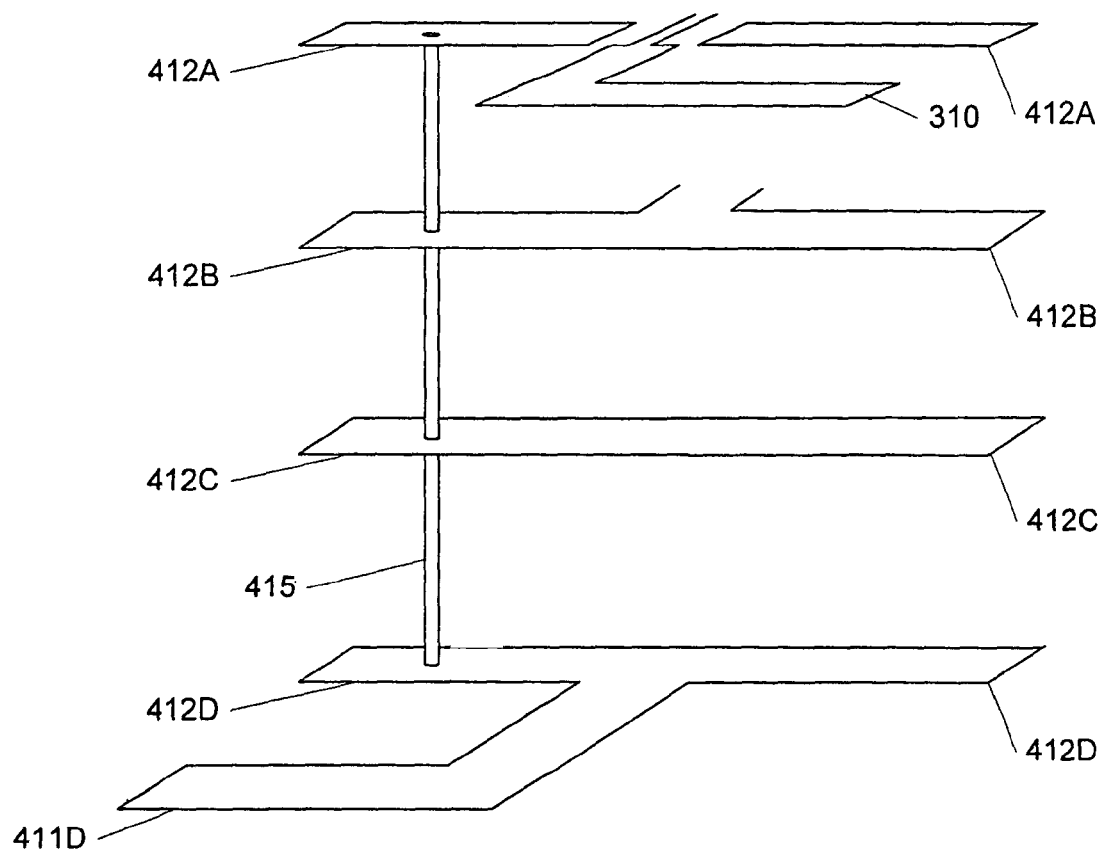
FIG. 4 illustrates the antenna element of FIG. 3A, showing multiple layers of the circuit board, in one embodiment of the invention.

FIG. 4 illustrates the antenna element 240A of FIG. 3A, showing multiple layers of the circuit board 105, in one embodiment of the invention. The circuit board 105 of this embodiment comprises a 60 mil thick stackup with three dielectrics and four metallization layers A-D, with an internal RF ground plane at layer B (10 mils from top layer A to the internal ground layer B). Layer B is separated by a 40 mil thick dielectric to the next layer C, which may comprise a power plane. Layer C is separated by a 10 mil dielectric to the bottom layer D.

The first dipole component 310 and portions 412A of the reflector 312 is formed on the first (exterior) surface layer A. In the second metallization layer B, which includes a connection to the ground layer (depicted as an open trace), corresponding portions 412B of the reflector 312 are formed. On the third metallization layer C, corresponding portions 412C of the reflector 312 are formed. The second dipole component 411D is formed along with corresponding portions of the reflector 412D on the fourth (exterior) surface metallization layer D. The reflectors 412A-D and the second dipole component 411D on the different layers are interconnected to the ground layer B by an array of metallized vias 415 (only one via 415 shown, for clarity) spaced less than ¹⁄₂₀th of a wavelength apart, as determined by an operating RF frequency range of 2.4-2.5 GHz for 802.11. It will be apparent to a person or ordinary skill that the reflector 312 comprises four layers, depicted as 412A-D.

An advantage of the antenna element 240A of FIG. 4 is that transitions in the RF path are avoided. Further, because of the cutaway portion of the reflector 412A and the array of vias interconnecting the layers of the circuit board 105, the antenna element 240A of this embodiment offers a good ground plane for the ground dipole 311 and the reflector element 312.

Figure 5A:
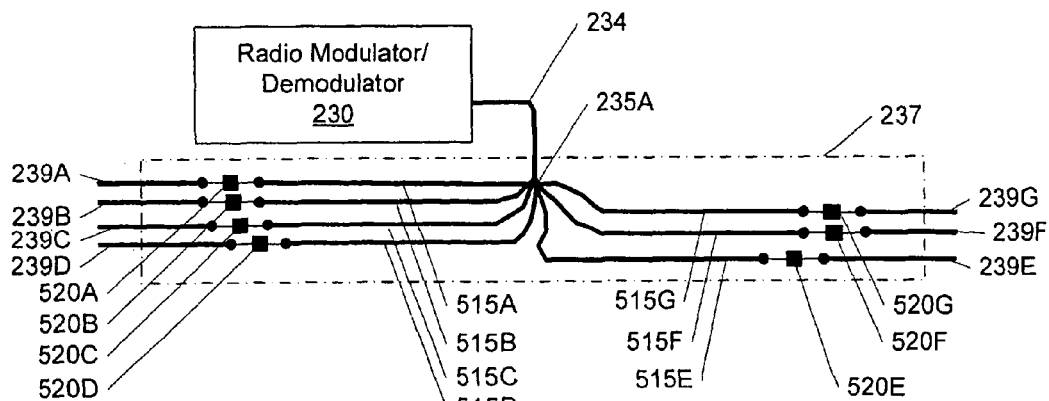
FIG. 5A illustrates the antenna feed port and the switching network of FIG. 2, in one embodiment in accordance with the present invention.

FIG. 5A illustrates the antenna feed port 235 and the switching network 237 of FIG. 2, in one embodiment in accordance with the present invention. The antenna feed port 235 of this embodiment receives the RF line 234 from the radio modem 230 into a distribution point 235A. From the distribution point 235A, impedance matched RF traces 515A-G extend to PIN diodes 520A-G. In one embodiment, the RF traces 515A-G comprise 20 mils wide traces, based upon a 10 mil dielectric from the internal ground layer (e.g., the ground layer B of FIG. 4). Feed lines 239A-G (only portions of the feed lines 239 are shown for clarity) extend from the PIN diodes 520A-G to each of the antenna elements 240.

Each PIN diode 520 comprises a single-pole single-throw switch to switch each antenna element 240 either on or off (i.e., couple or decouple each of the antenna elements 240 to the antenna feed port 235). In one embodiment, a series of control signals (not shown) is used to bias each PIN diode 520. With the PIN diode 520 forward biased and conducting a DC current, the PIN diode 520 is switched on, and the corresponding antenna element 240 is selected. With the PIN diode 520 reverse biased, the PIN diode 520 is switched off.

In one embodiment, the RF traces 515A-G are of length equal to a multiple of one half wavelength from the antenna feed port 235. Although depicted as equal length in FIG. 5A, the RF traces 515A-G may be unequal in length, but multiples of one half wavelength from the antenna feed port 235. For example, the RF trace 515A may be of zero length so that the PIN diode 520A is directly attached to the antenna feed port 235. The RF trace 515B may be one half wavelength, the RF trace 515C may be one wavelength, and so on, in any combination. The PIN diodes 520A-G are multiples of one half wavelength from the antenna feed port 235 so that disabling one PIN diode (e.g. the PIN diode 520A) does not create an RF mismatch that would cause RF reflections back to the distribution point 235A and to other traces 515 that are enabled (e.g., the trace 515B). In this fashion, when the PIN diode 520A is "off," the radio modem 230 sees a high impedance on the trace 515A, and the impedance of the trace 515B that is "on" is virtually unaffected by the PIN diode 540A. In some embodiments, the PIN diodes 520A-G are located at an offset from the one half wavelength distance. The offset is determined to account for stray capacitance in the distribution point 235A and/or the PIN diodes 520A-G.

Figure 5B:
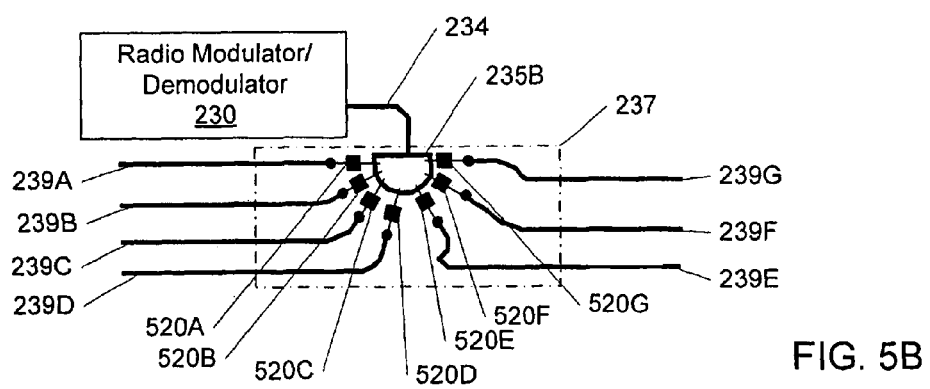
FIG. 5B illustrates the antenna feed port and the switching network of FIG. 2, in an alternative embodiment in accordance with the present invention.

FIG. 5B illustrates the antenna feed port 235 and the switching network 237 of FIG. 2, in an alternative embodiment in accordance with the present invention. The antenna feed port 235 of this embodiment receives the RF line 234 from the radio modem 230 into a distribution point 235B. The distribution point 235B of this embodiment is configured as a solder pad for the PIN diodes 520A-G. The PIN diodes 520A-G are soldered between the distribution point 235B and the ends of the feed lines 239A-G. In essence, the distribution point 235B of this embodiment acts as a zero wavelength distance from the antenna feed port 235. An advantage of this embodiment is that the feed lines extending from the PIN diodes 520A-G to the antenna elements 240A-G offer unbroken controlled impedance.

Figure 5C:
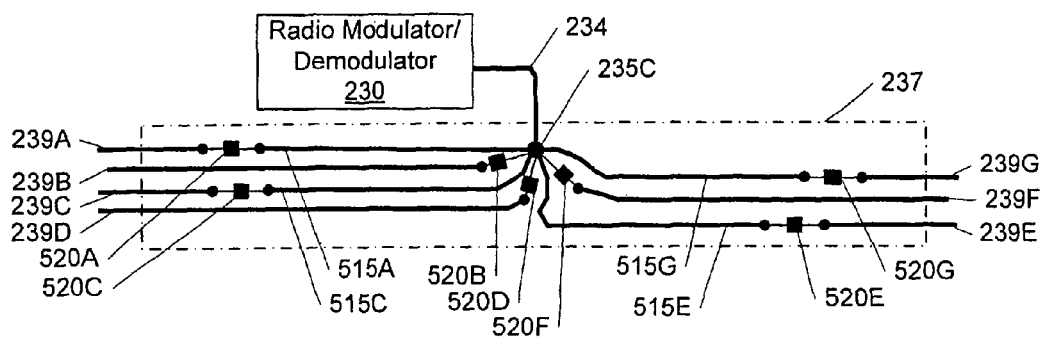
FIG. 5C illustrates the antenna feed port and the switching network of FIG. 2, in an alternative embodiment in accordance with the present invention.

FIG. 5C illustrates the antenna feed port and the switching network of FIG. 2, in an alternative embodiment in accordance with the present invention. This embodiment may be considered as a combination of the embodiments depicted in FIGS. 5A and 5B. The PIN diodes 520A, 520C, 520E, and 520G are connected to the RF traces 515A, 515C, 515E, and 515G, respectively, in similar fashion to that described with respect to FIG. 5A. However, the PIN diodes 520B, 520D, and 520F are soldered to a distribution point 235C and to the corresponding feed lines 239B, 239D, and 239F, in similar fashion to that described with respect to FIG. 5B.

Although the switching network 237 is described as comprising PIN diodes 520, it will be appreciated that the switching network 237 may comprise virtually any RF switching device such as a GaAs FET, as is well known in the art. In some embodiments, the switching network 237 comprises one or more single-pole multiple-throw switches. In some embodiments, one or more light emitting diodes (not shown) are coupled to the switching network 237 or the feed lines 239 as a visual indicator of which of the antenna elements 240 is on or off. In one embodiment, a light emitting diode is placed in circuit with each PIN diode 520 so that the light emitting diode is lit when the corresponding antenna element 240 is selected.

Referring to FIG. 2, because in some embodiments the antenna feed port 235 is not in the center of the circuit board 105, which would make the antenna feed lines 239 of equal length and minimum loss, the lengths of the antenna feed lines 239 may not comprise equivalent lengths from the antenna feed port 235. Unequal lengths of the antenna feed lines 239 may result in phase offsets between the antenna elements 240.

Accordingly, in some embodiments not shown in FIG. 2, each of the feed lines 239 to the antenna elements 240 are designed to be as long as the longest of the feed lines 239, even for antenna elements 240 that are relatively close to the antenna feed port 235. In some embodiments, the lengths of the feed lines 239 are designed to be a multiple of a half-wavelength offset from the longest of the feed lines 239. In still other embodiments, the lengths of the feed lines 239 which are odd multiples of one half wavelength from the other feed lines 239 incorporate a "phase-inverted" antenna element 240 to compensate. For example, referring to FIG. 2, the antenna elements 240C and 240F are inverted by 180 degrees because the feed lines 239C and 239F are 180 degrees out of phase from the feed lines 239A, 239B, 239D, 239E, and 239G. In an antenna element 240 that is phase inverted, the first dipole component (e.g., surface layer) replaces the second dipole component (e.g., ground layer). It will be appreciated that this provides the 180 degree phase shift in the antenna element to compensate for the 180 degree feed line phase shift.

An advantage of the system 100 (FIG. 1) incorporating the circuit board 105 having the peripheral antenna apparatus with selectable antenna elements 240 (FIG. 2) is that the antenna elements 240 are constructed directly on the circuit board 105, therefore the entire circuit board 105 can be easily manufactured at low cost. As depicted in FIG. 2, one embodiment or layout of the circuit board 105 comprises a substantially square or rectangular shape, so that the circuit board 105 is easily panelized from readily available circuit board material. As compared to a system incorporating externally-mounted vertically polarized "whip" antennas for diversity, the circuit board 105 minimizes or eliminates the possibility of damage to the antenna elements 240.

A further advantage of the circuit board 105 incorporating the peripheral antenna apparatus with selectable antenna elements 240 is that the antenna elements 240 may be configured to reduce interference in the wireless link between the system 100 and a remote receiving node. For example, the system 100 communicating over the wireless link to the remote receiving node may select a particular configuration of selected antenna elements 240 that minimizes interference over the wireless link. For example, if an interfering signal is received strongly via the antenna element 240C, and the remote receiving node is received strongly via the antenna element 240A, selecting only the antenna element 240A may reduce the interfering signal as opposed to selecting the antenna element 240C. The system 100 may select a configuration of selected antenna elements 240 corresponding to a maximum gain between the system and the remote receiving node. Alternatively, the system 100 may select a configuration of selected antenna elements 240 corresponding to less than maximal gain, but corresponding to reduced interference. Alternatively, the antenna elements 240 may be selected to form a combined omnidirectional radiation pattern.

Another advantage of the circuit board 105 is that the directional radiation pattern of the antenna elements 240 is substantially in the plane of the circuit board 105. When the circuit board 105 is mounted horizontally, the corresponding radiation patterns of the antenna elements 240 are horizontally polarized. Horizontally polarized RF energy tends to propagate better indoors than vertically polarized RF energy. Providing horizontally polarized signals improves interference rejection (potentially, up to 20 dB) from RF sources that use commonly-available vertically polarized antennas.

The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A system, comprising:
   a circuit board, wherein the circuit board comprises a radio modulator/demodulator that receives data from a network and converts the received network data into a modulated RF signal;
   communication circuitry coupled to the circuit board, wherein the communication circuitry provides the modulated signal from the radio modulator/demodulator to an antenna feed port of the circuit board; and
   a plurality of antenna elements arranged around a periphery of the circuit board, wherein the plurality of antenna elements include:
      a first antenna element located near a first periphery of the circuit board, wherein the first antenna element produces a first directional radiation pattern when coupled to the antenna feed port; and
      a second antenna element located near a second periphery of the circuit board, wherein the second antenna element produces a second directional radiation pattern offset from the first directional radiation pattern when coupled to the antenna feed port.

2. The system of claim 1 further comprising a switching network that selectively couples the antenna feed port to the first antenna element and the second antenna element.

3. The system of claim 2, wherein the switching network includes a first RF switch located at about a multiple of one-half wavelength from the antenna feed port, the first RF switch selectively couple the antenna feed port to the first antenna element.

4. The system of claim 1 further comprising:
   a first feed line coupled with the first antenna element; and
   a second feed line coupled with the second antenna element, wherein the second feed line having an electrical length difference of a multiple of one-half wavelength as compared to the first feed line.

5. The system of claim 1, wherein the first antenna element and the second antenna element collectively produce a substantially omnidirectional radiation coverage when the first antenna element and the second antenna element are coupled to the antenna feed port.

6. The system of claim 1, wherein the first antenna element includes a first and second dipole component that produces a generally cardioid directional radiation pattern substantially in the plane of the circuit board, the second dipole component extending substantially opposite from the first dipole component.

7. The system of claim 6, wherein the first and second dipole component includes a bent dipole component.

8. The system of claim 6, wherein the first antenna element further includes a reflector that concentrates the radiation pattern of the first antenna element.

9. The system of claim 6, wherein the first antenna element further includes a reflector that broadens the frequency response of the first antenna element.

10. The system of claim 1, wherein the first antenna element includes a first dipole component and a second dipole component, at least one of the first dipole component and the second dipole component formed on an exterior surface of the circuit board.

11. The system of claim 1, wherein the first antenna element includes a first dipole component formed on a surface of the circuit board and a second dipole component formed on an opposite surface of the circuit board, the second dipole component coupled to an internal ground layer of the circuit board.

12. A system, comprising:
   a circuit board, wherein the circuit board comprises a radio modulator/demodulator that receives data from a network and converts the received network data into a modulated RF signal;
   communication circuitry coupled to the circuit board, wherein the communication circuitry provides the modulated RF signal from the radio modulator/demodulator to an antenna feed port of the circuit board;
   a plurality of antenna elements arranged around a periphery of the circuit board, wherein the plurality of antenna elements include:
      a first antenna element located near a first periphery of the circuit board, wherein the first antenna element produces a first directional radiation pattern when coupled to the antenna feed port, and
      a second antenna element located near a second periphery of the circuit board, wherein the second antenna element produces a second directional radiation pattern offset from the first directional radiation pattern when coupled to the antenna feed port; and
   a switching network that selectively couples the antenna feed port to each of the plurality of antenna elements to result in a configurable radiation pattern ranging from highly directional to substantially non-directional.

13. The system of claim 12, wherein the switching network includes an RF switch for each of the antenna elements, the RF switch located at about a multiple of one-half wavelength from the antenna feed port.

14. The system of claim 13 further comprising a plurality of feed lines having electrical length difference of a multiple of one-half wavelength as compared to each other.

15. The system of claim 12, wherein at least one of the antenna elements includes a first and second dipole component that produces a generally cardioid directional radiation pattern substantially in the plane of the circuit board, the second dipole component extending substantially opposite from the first dipole component.

16. The system of claim 15, wherein at least one of the first and second dipole components is a phase inverted modified dipole.

17. The system of claim 12, further comprising a reflector that concentrates the radiation pattern of the antenna element.

18. The system of claim 12 further comprising a reflector that broadens the frequency response of the antenna element.

* * * * *